Oct. 5, 1965 E. P. BARBARO 3,209,428

PROCESS FOR TREATING SEMICONDUCTOR DEVICES

Filed July 20, 1961 2 Sheets-Sheet 1

DIFFUSION

MASKING

WITNESSES

Edwin E. Bassler

James F. Young

INVENTOR

Ernest P. Barbaro

BY V W Cleary

ATTORNEY

United States Patent Office 3,209,428

Patented Oct. 5, 1965

3,209,428

PROCESS FOR TREATING SEMICONDUCTOR DEVICES

Ernest P. Barbaro, Delmont, Pa., assignor to Westinghouse Electric Corporation, East Pittsburgh, Pa., a corporation of Pennsylvania Filed July 20, 1961, Ser. No. 125,503

2 Claims. (Cl. 29—25.3)

This invention relates to a method of producing a semiconductor switch.

In producing semiconductor devices or switches an important consideration is the current carrying capacity and current density of the device. In four-layer three terminal devices, the emitter junction should be made large, compared to the overall dimensions of the device, in order to provide relative low current density and relatively high current carrying capacity relative to the size of the device. Most configurations which provide a relatively large emitter junction, however, result in a base or gate connection which is positioned relative to the emitter so that the firing voltage and current between the emitter and base, necessary to break over the device to conduction, are so low as to make the device susceptible to extraneous firing signals.

In accordance with the present invention a method is provided to produce a four-region p-n-p-n type, three terminal semiconductor switch wherein after the emitter and gate or base are joined on the semiconductor body, the top and side surface of the emitter are masked as well as the base or gate connection. A source of compressed air is mixed with water and fine sand and applied to the unmasked area between the emitter and gate to provide a bombardment of fine sand particles under pressure against this area of the base. By this method it has been found that the bombardment of the base between the gate and emitter by the fine sand results in an increase of recombination in this area that increases the firing gate current by a factor of approximately five and increases the firing gate voltage by a factor of approximately two or three.

Accordingly, an object of the invention is to provide a method for producing a semiconductor switch which has relatively low current densities for the size of the device, yet has a relatively high firing voltage necessary to render the device conductive.

Another object of the invention is to provide a simple method for producing a four-layer p-n-p-n type semiconductor switch which will increase the gate to emitter firing voltage of the switch.

These and other objects of the invention will become more clearly apparent from the following description when taken in conjunction with the accompanying drawing. Referring to the drawing.

Figure 1:
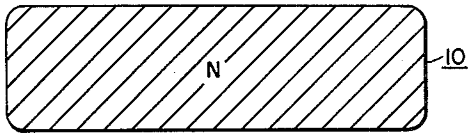
FIGURE 1 is an elevation view of a slice of n-type semiconductor materials.
Figure 2:
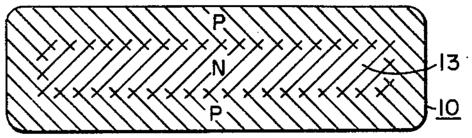
FIG. 2 shows the step of diffusing the semiconductor material with a p-type material.
Figure 3:
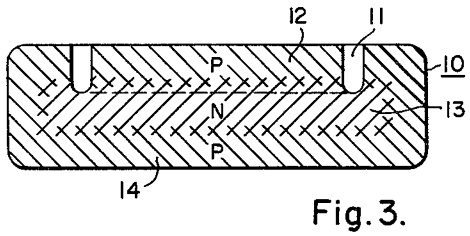
FIG. 3 illustrates the step of providing a groove in the diffused wafer shown in FIG. 2.
Figure 4:
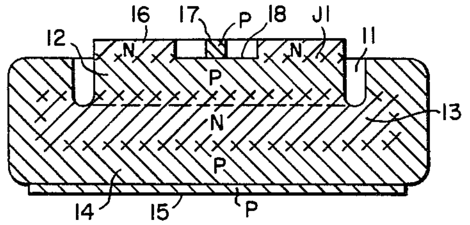
FIG. 4 illustrates the step of providing anode, base and gate connections to the semiconductor wafer of FIG. 3.
Figure 5:
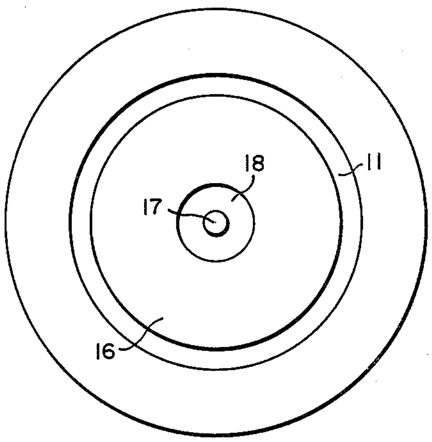
FIG. 5 is a plan view of the semiconductor shown in FIG. 4.

FIGS. 1 through 5 illustrate one method for producing a semiconductor switch having relatively low current densities for the size of the device and consequently having relatively high current carrying capacity for the size of the device. As shown in FIGS. 1 and 2, by this prior known method, an n-type circular semiconductor crystal 10 such as silicon, is diffused with a p-type material such as aluminum to provide an outer peripheral p-type layer with a surface concentration of $10^{18}$ atoms/cc. FIG. 3 illustrates the step of providing a circular groove 11 on one side of the semiconductor wafer to isolate the layers on both sides of the crystal and convert the wafer 10 into a three region device having a p region 12, an n region 13 and a p region 14. In this previously known method, a doughnut-shaped emitter 16 of an n-type material, shown in FIGS. 4 and 5, is alloyed to the p-type base layer 12 so as to provide a relatively large emitter junction. It will be understood that the emitter 16 can be diffused into the p-type base 12. This provides a rectifying emitter junction J1.

A p-type dot 17 is alloyed to the base region 12 and is concentric with the doughnut-shaped n region 16. The p-type region 17 is alloyed to the p region 12 to provide an ohmic contact necessary for the base connection of the three terminal device. Thus, it can be seen that the current applied at the base contact 17 must flow to the emitter 16 through a base to emitter region 18.

As will be understood the configuration of the four-layer three terminal switch shown in FIGS. 4 and 5 provides relatively low current densities due to the relatively large emitter junction J1. Other configurations are known which also have relatively low current densities due to a relatively large emitter junction.

Figure 6:
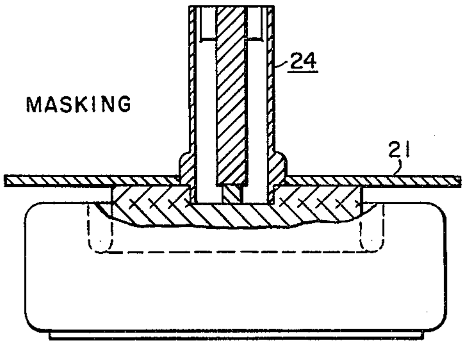
FIG. 6 illustrates the masking step of one embodiment of the invention.
Figures 7, 8, 9, 10:
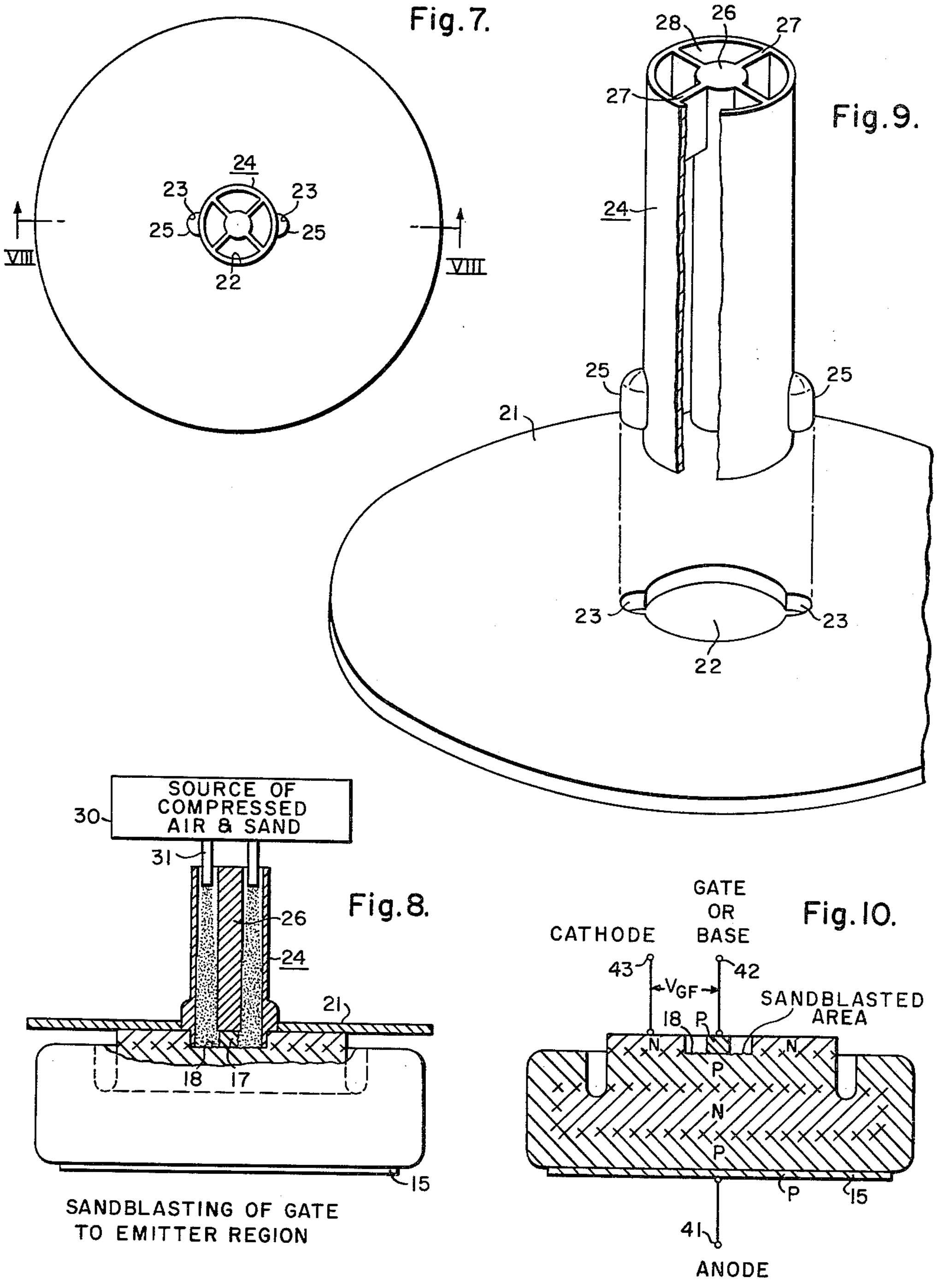
FIG. 7 is a plan view of the semiconductor mask shown in FIG. 6.
FIG. 8 is a cross-section view of FIG. 7 taken along A—A and illustrates the step of providing compressed air or steam mixed with sand to the region between the base and emitter of the semiconductor switch.
FIG. 9 illustrates a perspective view of a masking member employed in the step illustrated in FIG. 8.
FIG. 10 illustrates the device of FIG. 8, after sandblasting.

In the method of the present invention, the semiconductor so produced by the steps illustrated in FIGS. 1 through 5 is masked by a mask 21 shown in FIGS. 6 and 7 having a circular aperture 22 with two slots or recesses 23. The aperture 22 has a diameter approximately equal to the inside diameter of the emitter 16. A tubular member 24 having two keys 25 which mate with the slots 23 is positioned through the emitter mask 21 so as to completely mask the top and the sides of the emitter n-type region 16.

A shown in FIGS. 8 and 9 the tubular masking member 24 has a solid inner tubular member 26 fixedly mounted therein and concentric therewith. The inner tubular member 26 is held in place by ribs 27. Tubular member 24 has a diameter slightly larger than the gate or base dot 17. When the outer tubular member 24 is touching the surface of region 12, the bottom of the inner tubular member 26 is resting on the top of dot 17. By this method the emitter 16 and the p-type dot 17 are masked.

When the emitter 16 and dot 17 are masked as described above, apertures 28 between ribs 27 provide access to the unmasked emitter to gate area 18. In the next step this area 18 is sandblasted such as by a source of compressed air or steam mixed with sand 30 having a nozzle 31 which is placed over the apertures 28. When this is done, the fine sand particles bombard area 18 to provide small cavities therein as shown in FIG. 10. These cavities increase the surface recombination to thereby increase the gate firing voltage and current.

A group of semiconductor switches having the configuration illustrated in FIGS. 7, 8 and 10 were produced by the method outlined in FIGS. 1 through 5. N-type silicon discs having a diameter of 500 mils and a thickness of 9 mils were diffused with aluminum to a depth of 2 mils and a p-type concentration of $10^{18}$ atoms/cc. The n-type silicon disc had an impurity concentration of $10^{15}$ atoms/cc. The groove 11 was etched concentric with the disc with an inside diameter of 420 mils and an outside diameter of 470 mils, extending to a depth of about 4 or 5 mils. The emitter rings 16 were made of n-type gold with $10^{19}$ atoms/cc. of antimony with an outside diameter of 420 mils and an inside diameter of 125 mils. This ring 16 was ½ mil deep and was fused to region 12. A molybdenum anode ohmic contact 15 and a molybdenum gate ohmic contact 17 were alloyed with the gate or base contact having a diameter of 90 mils. The gate, cathode (or emitter) and anode connections 42, 43 and 41 were made.

A source of compressed air, fine 500 mesh sand, and water to carry the sand was prepared. The proportions of this mixture were varied and the air pressure maintained at about 15 or 16 p.s.i. The surface area 18 was masked as shown above and sandblasted (from 10 to 60 seconds) until it appeared as a matte or uniformly roughened finish having a roughness within the range of from about 10 to 40 microinches R.M.S. The cavities or disturbed layer caused by this sandblasting did not extend through the p region 12 but merely provided a uniformly matte surface.

The devices were tested before and after the gate to emitter region was sandblasted. The following are the results of these tests with $V_{GF}$ being the forward gate voltage (between terminals 42 and 43) necessary to render the device conductive between terminals 41 and 42 and $I_G$ being the forward gate current to render the device conductive. The forward breakover voltage of these devices ranged from approximately 300 volts to 500 volts. All readings were taken at 125° C. heat sink temperature.

| | Before Sand-blasting | | After Sand-blasting | |
|---|---|---|---|---|
| | $I_G$ | $V_{GF}$ | $I_G$ | $V_{GF}$ |
| | *Ma.* | *V* | *Ma.* | *V.* |
| 1 | 1.7 | .35 | 15 | .60 |
| 2 | 4.3 | .50 | 21 | 1.1 |
| 3 | 5.5 | .50 | 21 | 1.5 |
| 4 | 2.4 | .40 | 18 | 1.0 |
| 5 | 2.5 | .30 | 16 | .70 |
| 6 | 3.7 | .45 | 19 | 1.5 |

While I have described above the principles of my invention in connection with a specific method, it is to be clearly understood that this description is made only by way of example and not as a limitation to the scope of my invention as set forth in the objects thereof.

I claim as my invention:

1. A method of producing a semiconductor switch device comprising the steps of: forming a semiconductor structure including four successive regions of semiconductive material of alternate semiconductivity type, said four regions including an emitter region and a base region adjacent to said emitter region; forming an ohmic contact on said base region; treating the surface of said base region between said ohmic contact and said emitter region by bombarding with granular solid particles to produce a matte finish with a disturbed layer extending from said surface to a depth less than 2 mils.

2. A method of producing a semiconductor switch device comprising the steps of: forming a semiconductor structure including four successive regions of semiconductive material of alternate semiconductivity type, said four regions including an emitter region and a base region adjacent to said emitter region, said emitter region having an annular configuration; forming an ohmic contact on said base region surrounded by said emitter; positioning over said semiconductor device a mask member having a circular aperture approximately coinciding with the circular opening of said annular emitter; positioning a tubular member extending through said circular aperture, said tubular member comprising an outer tubular member having one end in contact with said surface with a concentric solid inner cylindrical member fixedly mounted therein and connected thereto by ribs and in contact with said ohmic contact; introducing into the free end of said tubular member a mixture of air and fine sand at a pressure of about 15 p.s.i. to 16 p.s.i. for a time of from about 10 to about 60 seconds to roughen said surface and increase the surface recombination rate thereof.

References Cited by the Examiner

UNITED STATES PATENTS

| | | | |
|---|---|---|---|
| 2,560,594 | 7/51 | Pearson | 29—25.3 X |
| 2,935,453 | 5/60 | Saubestre | 317—235 X |
| 2,953,730 | 9/60 | Pankove | 317—235 |
| 2,980,832 | 4/61 | Stein et al. | 317—235 |
| 2,987,799 | 6/61 | North | 29—25.3 |
| 3,009,841 | 11/61 | Faust | 148—1.5 |
| 3,012,921 | 12/61 | Vaughan | 148—1.5 X |
| 3,023,347 | 2/62 | Strull | 29—25.3 X |
| 3,149,395 | 9/64 | Bray et al. | 29—25.3 |

OTHER REFERENCES

Text—Semi-Conductors, by Hannsay, published 1959, by Reinhold Publishing Corp., New York, N.Y., pages 489–490.

WHITMORE A. WILTZ, *Primary Examiner.*

LEON PEAR, JOHN F. CAMPBELL, *Examiners.*